(12) United States Patent
Obinata

(10) Patent No.: US 12,169,331 B2
(45) Date of Patent: Dec. 17, 2024

(54) DISPLAY DEVICE WITH TOUCH SENSORS AND ITS WIRING

(71) Applicant: Japan Display Inc., Tokyo (JP)

(72) Inventor: Naoyuki Obinata, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 18/499,272

(22) Filed: Nov. 1, 2023

(65) Prior Publication Data

US 2024/0061287 A1 Feb. 22, 2024

Related U.S. Application Data

(60) Division of application No. 17/526,093, filed on Nov. 15, 2021, now Pat. No. 11,841,570, which is a
(Continued)

(30) Foreign Application Priority Data

May 30, 2018 (JP) ................................ 2018-103380

(51) Int. Cl.
*G02F 1/1333* (2006.01)
*G02F 1/1343* (2006.01)
(Continued)

(52) U.S. Cl.
CPC .... *G02F 1/13338* (2013.01); *G02F 1/134309* (2013.01); *G02F 1/134318* (2021.01);
(Continued)

(58) Field of Classification Search
None
See application file for complete search history.

(56) References Cited

U.S. PATENT DOCUMENTS 9,470,941 B2 10/2016 Park et al.
2015/0017788 A1 6/2015 Shin et al.
(Continued)

FOREIGN PATENT DOCUMENTS

JP 2015122057 A 7/2015

OTHER PUBLICATIONS

English machine translation of Notice of Reasons for Refusal issued Mar. 8, 2022 in Japanese Patent Application No. 2018-103380, 5 pages.

*Primary Examiner* — Parul H Gupta
(74) *Attorney, Agent, or Firm* — Maier & Maier, PLLC

(57) ABSTRACT

A display device includes first and second common electrodes arranged in a first direction and separated from each other, a signal line located between the first and second common electrodes and extending in a second direction crossing the first direction, a pixel electrode electrically connected to the signal line and overlapping the first common electrode, a first metal line located between the first and second common electrodes and extending in the second direction, and a third common electrode arranged and extending in the second direction and separated from the first common electrode, overlapping the signal line. The first metal line is applied a predetermined voltage from plural connection portions, and includes arranged in the second direction a first line portion adjacent and electrically connected to the first common electrode and a second line portion, separated from the first line portion, and adjacent and electrically connected to the third common electrode.

5 Claims, 12 Drawing Sheets

Related U.S. Application Data continuation of application No. 16/416,780, filed on May 20, 2019, now Pat. No. 11,209,686.

(51) Int. Cl.

| | | |
|---|---|---|
| *G02F 1/1345* | (2006.01) | |
| *G02F 1/1362* | (2006.01) | |
| *G06F 3/041* | (2006.01) | |
| *G06F 3/044* | (2006.01) | |
| *G09G 3/36* | (2006.01) | |
| *H01L 27/12* | (2006.01) | |
| *G02F 1/1335* | (2006.01) | |
| *G02F 1/1337* | (2006.01) | |
| *G02F 1/1368* | (2006.01) | |

(52) U.S. Cl.
CPC ...... *G02F 1/13439* (2013.01); *G02F 1/13452* (2013.01); *G02F 1/136286* (2013.01); *G06F 3/0412* (2013.01); *G06F 3/0443* (2019.05); *G06F 3/0446* (2019.05); *G09G 3/3677* (2013.01); *H01L 27/124* (2013.01); *H01L 27/1244* (2013.01); *G02F 1/133512* (2013.01); *G02F 1/133514* (2013.01); *G02F 1/133528* (2013.01); *G02F 1/1337* (2013.01); *G02F 1/133738* (2021.01); *G02F 1/134372* (2021.01); *G02F 1/1368* (2013.01); *G06F 2203/04107* (2013.01); *G09G 2300/0413* (2013.01); *G09G 2300/0426* (2013.01)

(56) References Cited

U.S. PATENT DOCUMENTS

| | | |
|---|---|---|
| 2016/0223876 A1 | 8/2016 | Yamamoto et al. |
| 2016/0253023 A1 | 9/2016 | Aoyama et al. |
| 2016/0306454 A1* | 10/2016 | Wang .................... G06F 3/0412 |
| 2017/0177125 A1* | 6/2017 | Kim ........................ G06F 3/016 |
| 2017/0185181 A1* | 6/2017 | Kim ....................... G06F 3/0412 |
| 2017/0185196 A1 | 6/2017 | Kim et al. |
| 2019/0050100 A1 | 2/2019 | Ma et al. |
| 2019/0302557 A1* | 10/2019 | Obinata ............ G02F 1/134336 |

* cited by examiner

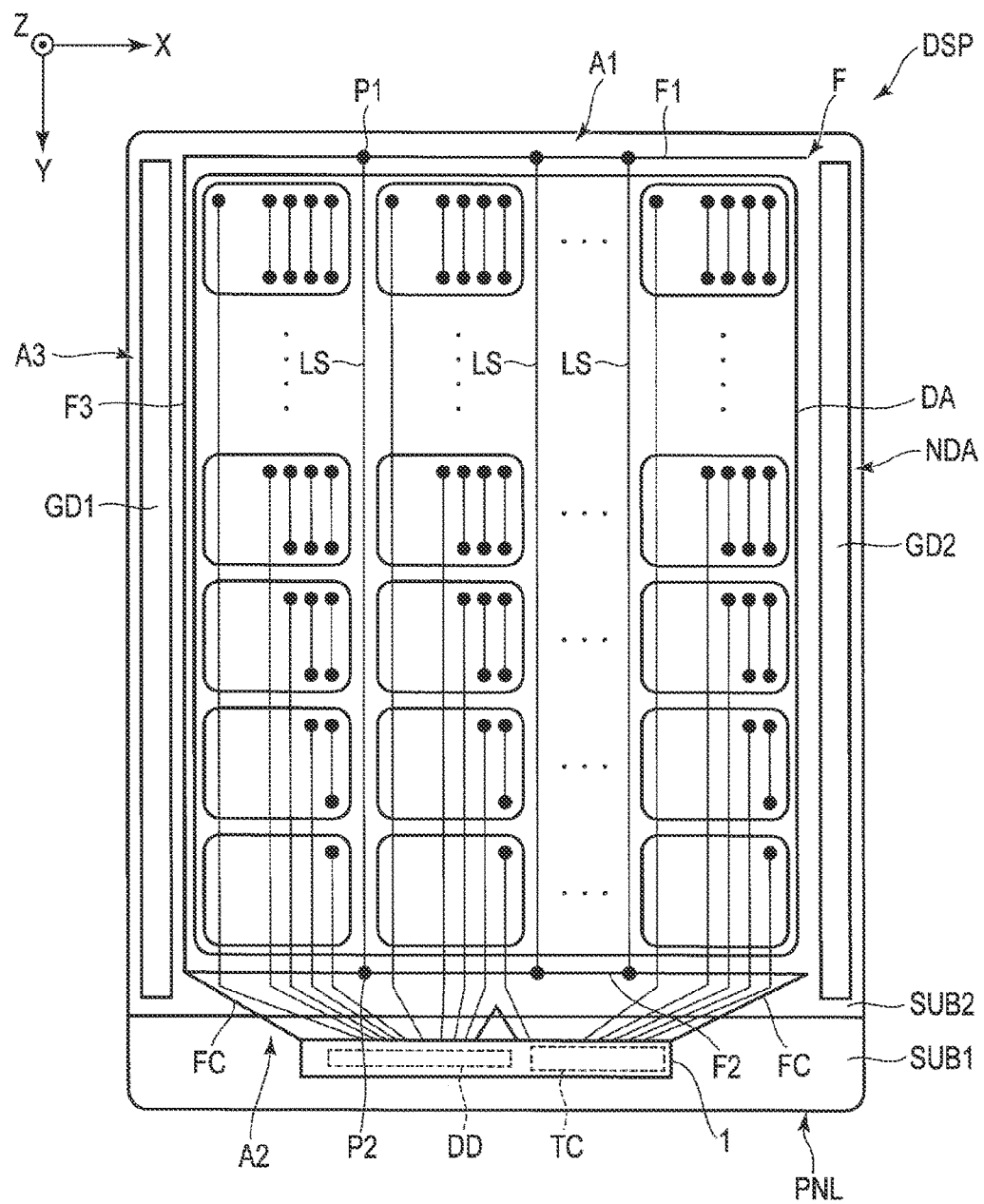
F I G. 2

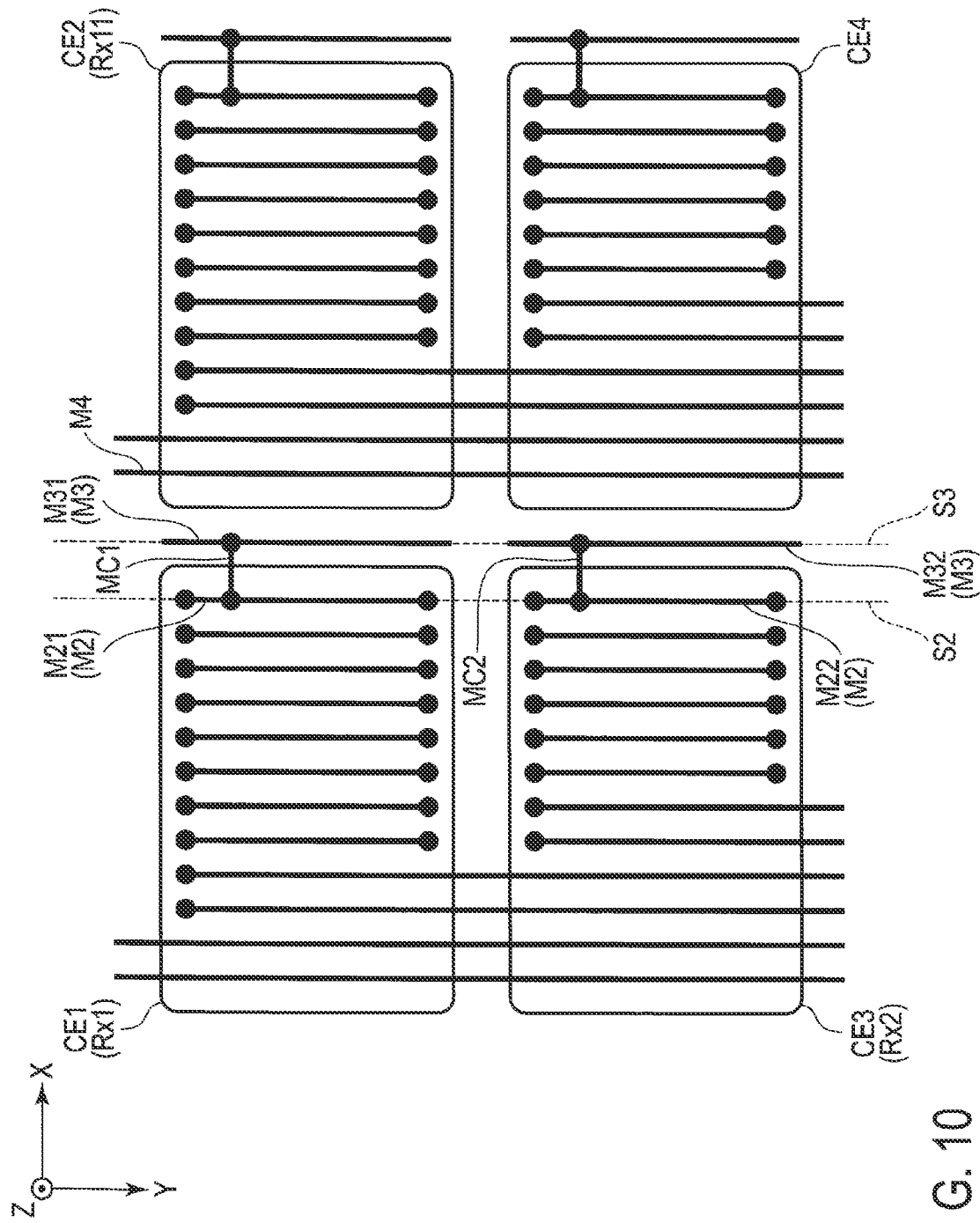
F I G. 10

DISPLAY DEVICE WITH TOUCH SENSORS AND ITS WIRING

CROSS-REFERENCE TO RELATED APPLICATIONS

This application is a divisional of U.S. application Ser. No. 17/526,093, filed Nov. 15, 2021, which is a continuation of and claims the benefit of priority under 35 U.S.C. § 120 from U.S. application Ser. No. 16/416,780 filed May 20, 2019, and claims the benefit of priority from Japanese Patent Application No. 2018-103380 filed May 30, 2018, the entire contents of each of which are incorporated herein by reference.

FIELD

Embodiments described herein relate generally to a display device.

BACKGROUND

Recently, various display devices with built-in touch sensors have been proposed. In one example, a display device structured such that electrodes formed on a display panel function as sensor electrodes in the case of a touch sensing mode and function as common electrodes in the case of a display mode has been disclosed. As a touch sensing method, a mutual-capacitance type or a self-capacitance type is applied. In the touch sensing mode, sensing is carried out as a touch drive voltage is applied to the sensor electrodes through signal lines.

BRIEF DESCRIPTION OF THE DRAWINGS

FIG. 2 is a plan view showing another configuration example of the display device DSP of the present embodiment.

FIG. 10 is a plan view showing another configuration example.

DETAILED DESCRIPTION

Figure 1:
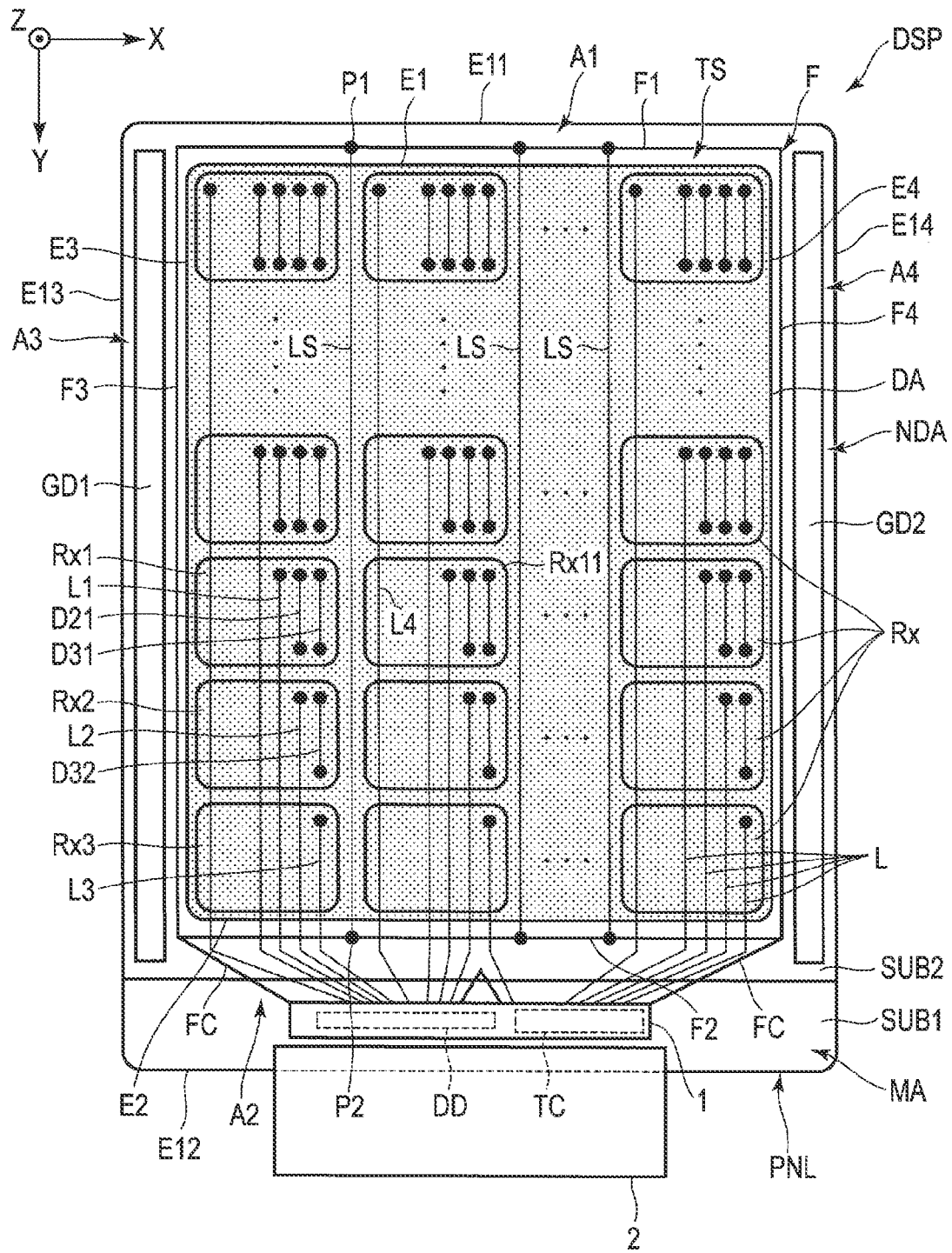
FIG. 1 is a plan view showing a configuration example of a display device DSP of the present embodiment.

In general, according to one embodiment, there is provided a display device comprising a first common electrode and a second common electrode arranged in a first direction and separated from each other, a signal line located between the first common electrode and the second common electrode and extending in a second direction crossing the first direction, a pixel electrode electrically connected to the signal line and overlapping the first common electrode, and a first metal line located between the first common electrode and the second common electrode, overlapping the signal line, and extending in the second direction. The first metal line is applied a predetermined voltage from a plurality of connection portions.

According to another embodiment, there is provided a display device comprising a display portion and a non-display portion surrounding the display portion. The display device comprises a first common electrode, a second common electrode and a third common electrode arranged in a first direction in the display portion and separated from each other, a first metal line located between the first common electrode and the second common electrode and extending in a second direction crossing the first direction, a second metal line located between the second common electrode and the third common electrode and extending in the second direction, and a feed line disposed in the non-display portion. One end of the first metal line and one end of the second metal line are electrically connected to the feed line.

According to yet another embodiment, there is provided a display device comprising a first common electrode and a second common electrode arranged in a first direction and separated from each other, a first metal line located between the first common electrode and the second common electrode and extending in a second direction crossing the first direction, and a third common electrode arranged in the second direction and separated from the first common electrode. The first metal line comprises a first line portion adjacent to the first common electrode and electrically connected to the first common electrode and a second line portion adjacent to the third common electrode and electrically connected to the third common electrode. The first line portion and the second line portion are arranged in the second direction and separated from each other.

Embodiments will be described hereinafter with reference to the accompanying drawings. The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

FIG. 1 is a plan view showing a configuration example of a display device DSP of the present embodiment. A first direction X, a second direction Y and a third direction Z orthogonally cross each other in one example but may cross at an angle other than 90 degrees. The first direction X and the second direction Y correspond to directions parallel to a surface of a substrate constituting the display device DSP, and the third direction Z corresponds to a thickness direction of the display device DSP. In the specification, a position on the pointing end side of an arrow indicating the third direction Z will be referred to as above and a position on the opposite side to the pointing end of the arrow will be referred to as below. When a second member is described as "a second member above a first member" or "a second member below a first member", the second member may be in contact with the first member or may be separated from the first member. In addition, an observation position at which the display device DSP is observed is assumed to be located on the pointing end side of the arrow indicating the third direction Z, and a view from this observation position toward an X-Y plane defined by the first direction X and the second direction Y will be referred to as planar view.

The display device DSP comprises a display panel PNL, an IC chip 1 and a flexible printed circuit board 2. The display panel PNL comprises a first substrate SUB1 and a second substrate SUB2. The first substrate SUB1 and the second substrate 2 overlap each other in planar view. The display panel PNL comprises a display portion DA in which an image is displayed and a frame-shaped non-display portion NDA which surrounds the display portion DA. The display portion DA is provided in an area in which the first substrate SUB1 and the second substrate SUB2 overlap each other.

The display panel PNL further comprises a touch sensor TS. The touch sensor TS is provided in the display portion DA in the example illustrated but may also be provided in the non-display portion NDA. The main part of the touch sensor TS is provided in the first substrate SUB1.

The first substrate SUB1 has a mounting portion MA which extends further in the second direction Y with respect to the second substrate SUB2. The IC chip 1 and the flexible printed circuit board 2 are connected to the mounting portion MA. Note that the IC chip 1 may be connected to the flexible printed circuit board 2. A display driver DD and a touch controller TC are incorporated in the IC chip 1. The display driver DD outputs a signal necessary for image display such as a video signal to the display panel PNL in an image display mode of displaying an image. The touch controller TC controls the touch sensor TS in a touch sensing mode of detecting approach or contact of an object to the display device DSP. Note that the touch controller TC may be incorporated in an IC chip other than that of the display driver DD.

Although the touch sensor TS of the self-capacitance type will be described here, the touch sensor TS may be of the mutual-capacitance type. The touch sensor TS comprises a plurality of sensor electrodes Rx and a plurality of sensor wiring lines L. The sensor electrodes Rx are located in the display portion DA and are arranged in a matrix in the first direction X and the second direction Y. The sensor wiring lines L extend in the second direction Y and are arranged in the first direction X in the display portion DA. Each of the sensor wiring lines L is provided at a position overlapping a signal line S which will be described later, for example. In addition, each of the sensor wiring lines L is drawn to the non-display portion NDA, is electrically connected to the IC chip 1 and is electrically connected to the touch controller TC inside the IC chip 1.

Here, attention is focused on the relationship between sensor wiring lines L1 to L3 arranged in the first direction X and sensor electrodes Rx1 to Rx3 arranged in the second direction Y. The sensor wiring line L1 overlaps the sensor electrodes Rx1 to Rx3 and is electrically connected to the sensor electrode Rx1.

The sensor wiring line L2 overlaps the sensor electrodes Rx2 and Rx3 and is electrically connected to the sensor electrode Rx2. A dummy wiring line D21 is separated from the sensor wiring line L2. The dummy wiring line D21 overlaps the sensor electrode Rx1 and is electrically connected to the sensor electrode Rx1. The sensor wiring line L2 and the dummy wiring line D21 are located on the same signal line as will be described later.

The sensor wiring line L3 overlaps the sensor electrode Rx3 and is electrically connected to the sensor electrode Rx3. A dummy wiring line D31 overlaps the sensor electrode Rx1 and is electrically connected to the sensor electrode Rx1. A dummy wiring line D32 is separated from the dummy wiring line D31 and the sensor wiring line L3. The dummy wiring line D32 overlaps the sensor electrode Rx2 and is electrically connected to the sensor electrode Rx2. The sensor wiring line L3 and the dummy wiring lines D31 and D32 are located on the same signal line.

In the touch sensing mode, the touch controller TC applies a sensor drive voltage to the sensor wiring lines L. Consequently, the sensor drive voltage is applied to the sensor electrodes Rx, and touch sensing is carried out in the sensor electrodes Rx. Sensor signals corresponding to the results of sensing in the sensor electrodes Rx are output to the touch controller TC via the sensor wiring lines L. The touch controller TC or an external host detects the presence or absence of approach or contact of an object to the display device DSP and the position coordinates of the object based on the sensor signals.

In the image display mode, a common voltage (Vcom) is applied to the sensor electrodes Rx. The common voltage is applied from a voltage supply unit included in the display driver DD via the sensor wiring lines L, for example.

The display portion DA has a pair of edge portions E1 and E2 extending in the first direction X and a pair of edge portions E3 and E4 extending in the second direction Y. The display panel PNL has a pair of edge portions E11 and E12 extending in the first direction X and a pair of edge portions E13 and E14 extending in the second direction Y. Each corner portion of the display portion DA and each corner portion of the display panel PNL are rounded in the example illustrated but may be substantially right-angled.

The non-display portion NDA has areas A1 to A4. The area A1 is an area between the edge portions E1 and E11, the area A2 is an area between the edge portions E2 and E12, the area A3 is an area between the edge portions E3 and E13, and the area A4 is an area between the edge portions E4 and E14.

The first substrate SUB1 comprises gate drivers GD1 and GD2, a feed line F and shield wiring lines LS. The gate drivers GD1 and GD2 and the feed line F are arranged in the non-display portion NDA. The shield wiring lines LS are disposed in the display portion DA and are extended to the non-display portion NDA.

In the example illustrated, the gate driver GD1 is provided in the area A3, the gate driver GD2 is provided in the area A4, the IC chip 1 and the flexible printed circuit board 2 are provided in the area A2, and the feed line F is formed in the shape of a frame surrounding the display portion DA. That is, the feed line F comprises feed portions F1 to F4 which are connected to each other. The feed portions F1 to F4 are arranged in the areas A1 to A4 of the non-display portion NDA, respectively. The feed portions F1 and F2 extend in the first direction X. In the area A2, the feed portion F2 is located between the IC chip 1 (or the display driver DD and the touch controller TC) and the edge portion E2 of the display portion DA. The feed portions F3 and F4 extend in the second direction Y. In the area A3, the feed portion F3 is located between the gate driver GD1 and the edge portion E3 of the display portion DA. In the area A4, the feed portion F4 is located between the gate driver GD2 and the edge portion E4 of the display portion DA.

The feed line F is electrically connected to the IC chip 1 via two connection lines FC, for example. Regarding a voltage supplied to the feed line F, for example, the power supply unit included in the display driver DD applies the common voltage (Vcom) to the feed line F in the image display mode, and the touch controller TC applies substantially the same voltage as the sensor drive voltage to the feed line F in the touch sensing mode.

The shield wiring lines LS extend in the second direction Y and are arranged in the first direction X in the display portion DA. Each of the shield wiring lines LS is located on a signal line which will be described later and has the function of shielding against an electric field from the signal line. Each of the shield wiring lines LS is located between two sensor electrodes Rx arranged in the first direction X and do not overlap these sensor electrodes Rx. A predetermined voltage is applied from a plurality of connection portions (feed points) to each of the shield wiring lines LS.

For example, attention is focused on the shield wiring line LS located between the sensor electrode Rx1 and the sensor electrode Rx11 in the drawing. The shield wiring line LS is located between the dummy wiring line D31 and a sensor wiring line L4. One end side of the shield wiring line LS is electrically connected to the feed portion F1 in a connection portion P1 located in the area A1. In addition, the other end side of the shield wiring line LS is electrically connected to the feed portion F2 in a connection portion P2 located in the area A2. Consequently, the predetermined voltage is applied from the feed line F to the shield wiring line LS. The predetermined voltage supplied from the feed line F changes between the image display mode and the touch sensing mode as described above. That is, the sensor drive voltage is applied to the feed line F in the touch sensing mode and the common voltage (Vcom) is applied to the feed line F in the image display mode.

According to the present embodiment, even if the shield wiring line LS is disconnected along the way, a portion from the disconnection position to one end side is fed from the connection portion P1 and a portion from the disconnection position to the other end side is fed from the connection portion P2. Therefore, the shield wiring line LS will not be partially electrically-floating and the predetermine voltage can be applied to the entire shield wiring line LS. As a result, it is possible to shield against the electric field from the signal line in the image display mode and the touch sensing mode and suppress display quality degradation.

In addition, since the feed portion F2 functions as a bus wiring line connected to each of the shield wiring lines LS, the number of connection terminals can be reduced as compared to a configuration example where each of the shield wiring lines LS is directly connected to a signal source.

Figure 3:
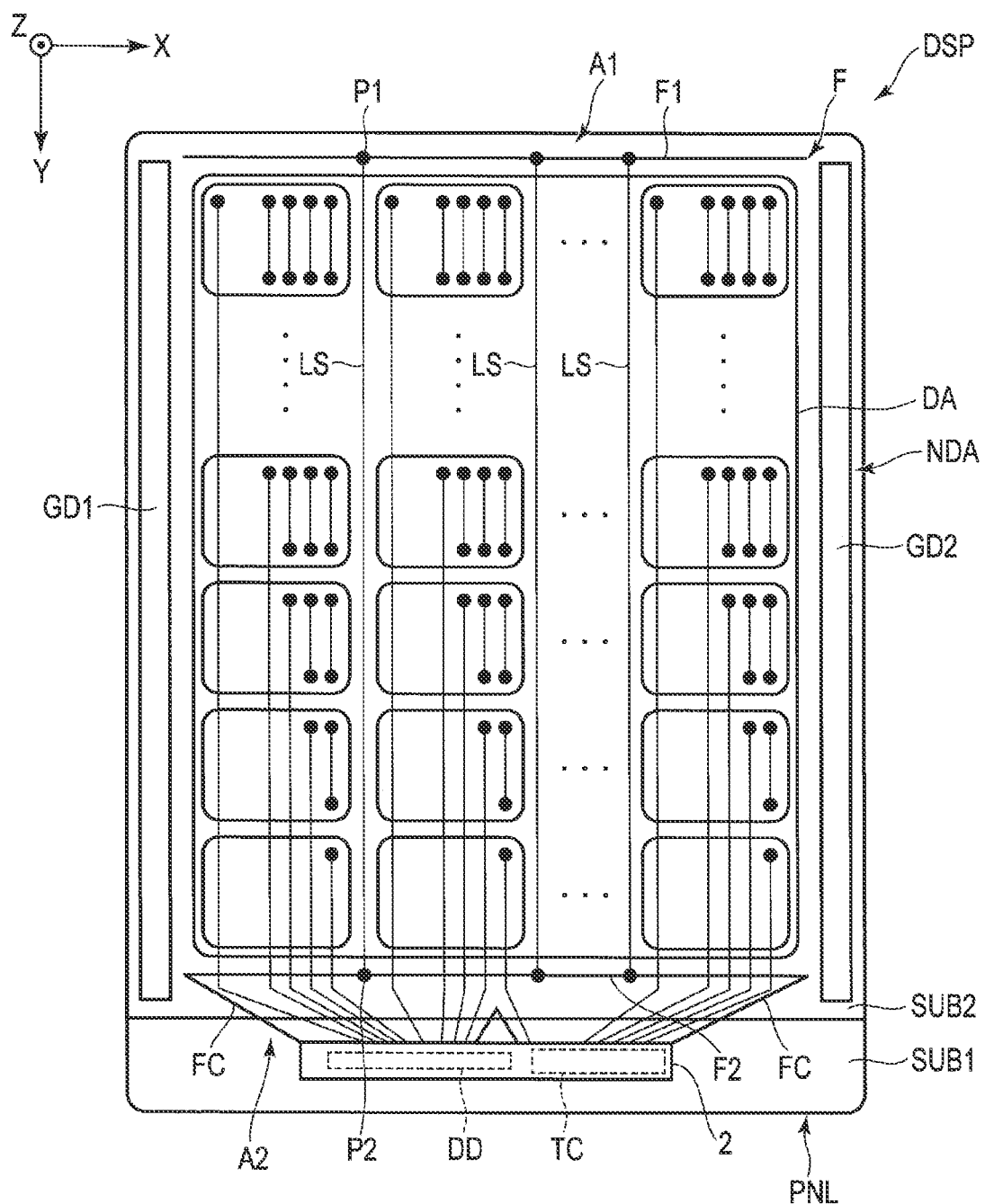
FIG. 3 is a plan view showing another configuration example of the display device DSP of the present embodiment.

Although the feed line F is frame-shaped in the configuration example shown in FIG. 1, the feed line F is not limited to this example and only needs to be arranged at least in the areas A1 and A2. For example, the feed line F in the configuration example shown in FIG. 2 comprises feed portions F1 to F3 which are connected to each other. The feed portions F1 to F3 are arranged in the areas A1 to A3 of the non-display portion NDA, respectively. In addition, the feed line F in the configuration example shown in FIG. 3 comprises feed portions F1 and F2 which are separated from each other. The feed portions F1 and F2 are electrically connected to each other via the shield wiring lines LS. Also in the configuration examples shown in FIGS. 2 and 3, it is possible to obtain substantially the same effects as the configuration example shown in FIG. 1.

Figure 4:
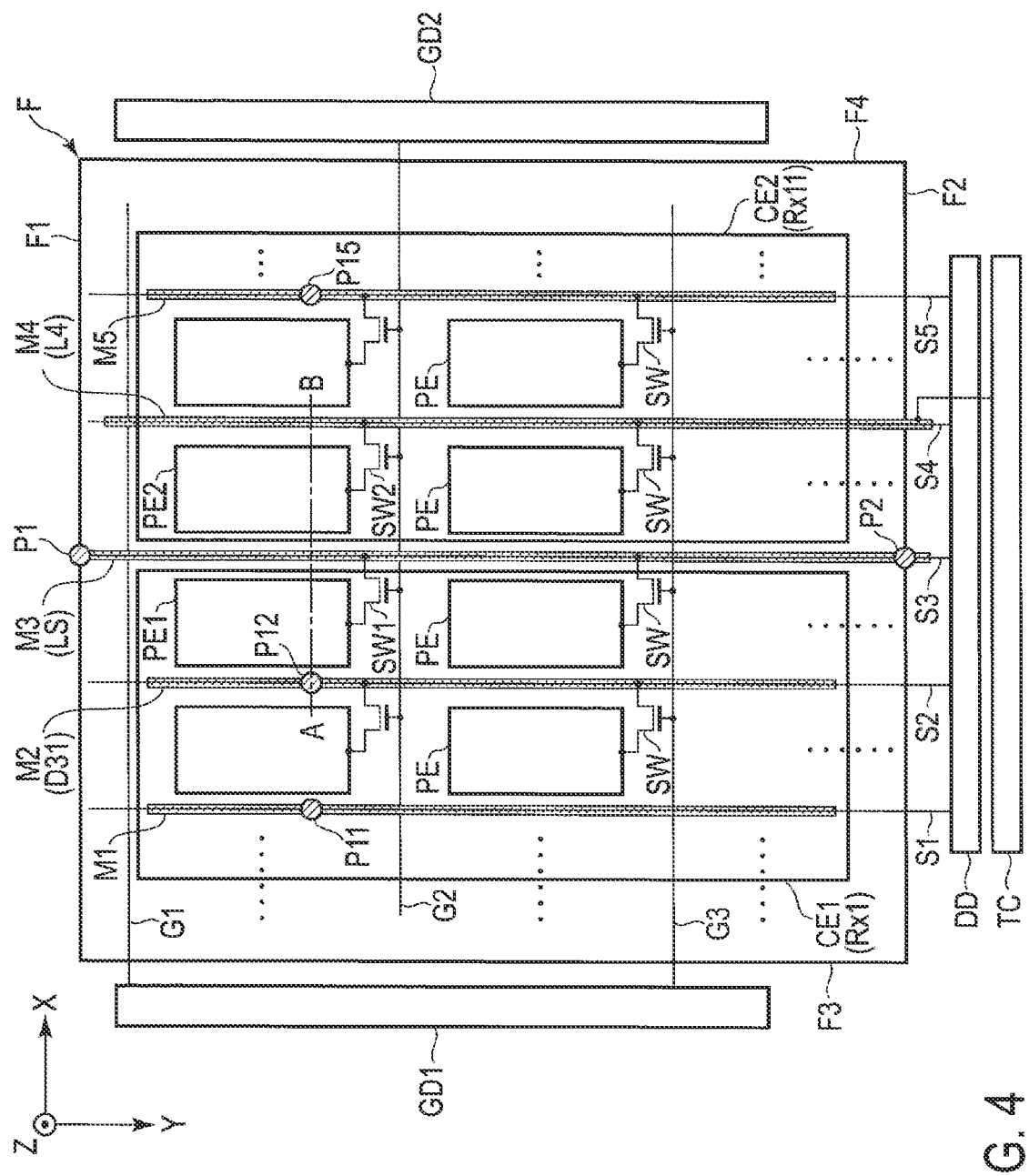
FIG. 4 is an enlarged plan view of an area including sensor electrodes Rx1 and Rx11 shown in FIG. 1.

FIG. 4 is an enlarged plan view of an area including the sensor electrodes Rx1 and Rx11 shown in FIG. 1. Scanning lines G1 to G3 extend in the first direction X and are arranged in the second direction Y and separated from each other. The scanning lines G1 and G3 cross the feed portion F3 and are electrically connected to the gate driver GD1. The scanning line G2 crosses the feed portion F4 and is electrically connected to the gate driver GD2. Note that the scanning lines G1 to G3 may be electrically connected to both of the gate drivers GD1 and GD2.

Signal lines S1 to S5 extend in the second direction Y and are arranged in the first direction X and separated from each other. The signal lines S1 to S5 cross the feed portion F2 and are electrically connected to the display driver DD. Note that the signal lines S1 to S5 are assumed to extend in the second direction Y even if parts of the signal lines S1 to S5 are bent.

Common electrodes CE1 and CE2 are arranged in the first direction X and separated from each other. The common electrode CE1 corresponds to the sensor electrode Rx1 shown in FIG. 1 and the common electrode CE2 corresponds to the sensor electrode Rx11 shown in FIG. 1.

A plurality of pixel electrodes PE overlap each of the common electrodes CE1 and CE2. Each of the pixel electrodes PE is electrically connected to any one of the signal lines S1 to S5 via a switching element SW. For example, a switching element SW1 in the drawing is electrically connected to the scanning line G2 and the signal line S3. A pixel electrode PE1 overlaps the common electrode CE1 and is electrically connected to the signal line S3 via the switching element SW1. In addition, a pixel electrode PE2 overlaps the common electrode CE2 and is electrically connected to the signal line S4 via a switching element SW2.

Metal lines M1 to M5 extend in the second direction Y and are arranged in the first direction X and separated from each other. The metal lines M1 to M5 overlap the signal lines S1 to S5, respectively. The metal line M2 corresponds to the dummy wiring line D31 shown in FIG. 1, the metal line M3 corresponds to the shield wiring line LS shown in FIG. 1, and the metal line M4 corresponds to the sensor wiring line L4 shown in FIG. 1.

The common electrode CE1 overlaps the metal lines M1 and M2 and is electrically connected to the metal lines M1 and M2 in connection portions P11 and P12, respectively.

The common electrode CE2 overlaps the metal lines M4 and M5 and is electrically connected to the metal line M5 in a connection portion P15. In the example illustrated, the common electrode CE2 and the metal line M4 are not electrically connected to each other. The metal line M4 crosses the feed portion F2 and is electrically connected to the touch controller TC.

The signal line S3 and the metal line M3 are located between the common electrode CE1 and the common electrode CE2. The metal line M3 is electrically connected to the feed portion F1 in the connection portion P1 located on one end side thereof and is electrically connected to the feed portion F2 in the connection portion P2 located on the other end side thereof.

In the configuration examples shown in FIGS. 1 to 4, for example, the common electrode CE1 corresponds to the first common electrode, the common electrode CE2 corresponds to the second common electrode, the metal line M3 corresponds to the first metal line, the metal line M2 corresponds to the second metal line, the metal line M4 corresponds to the third metal line, the connection portion P1 corresponds to the first connection portion, the connection portion P2 corresponds to the second connection portion, the feed portion F1 corresponds to the first feed portion, the feed portion F2 corresponds to the second feed portion, the area A1 corresponds to the first area, and the area A2 corresponds to the second area.

Figure 5:
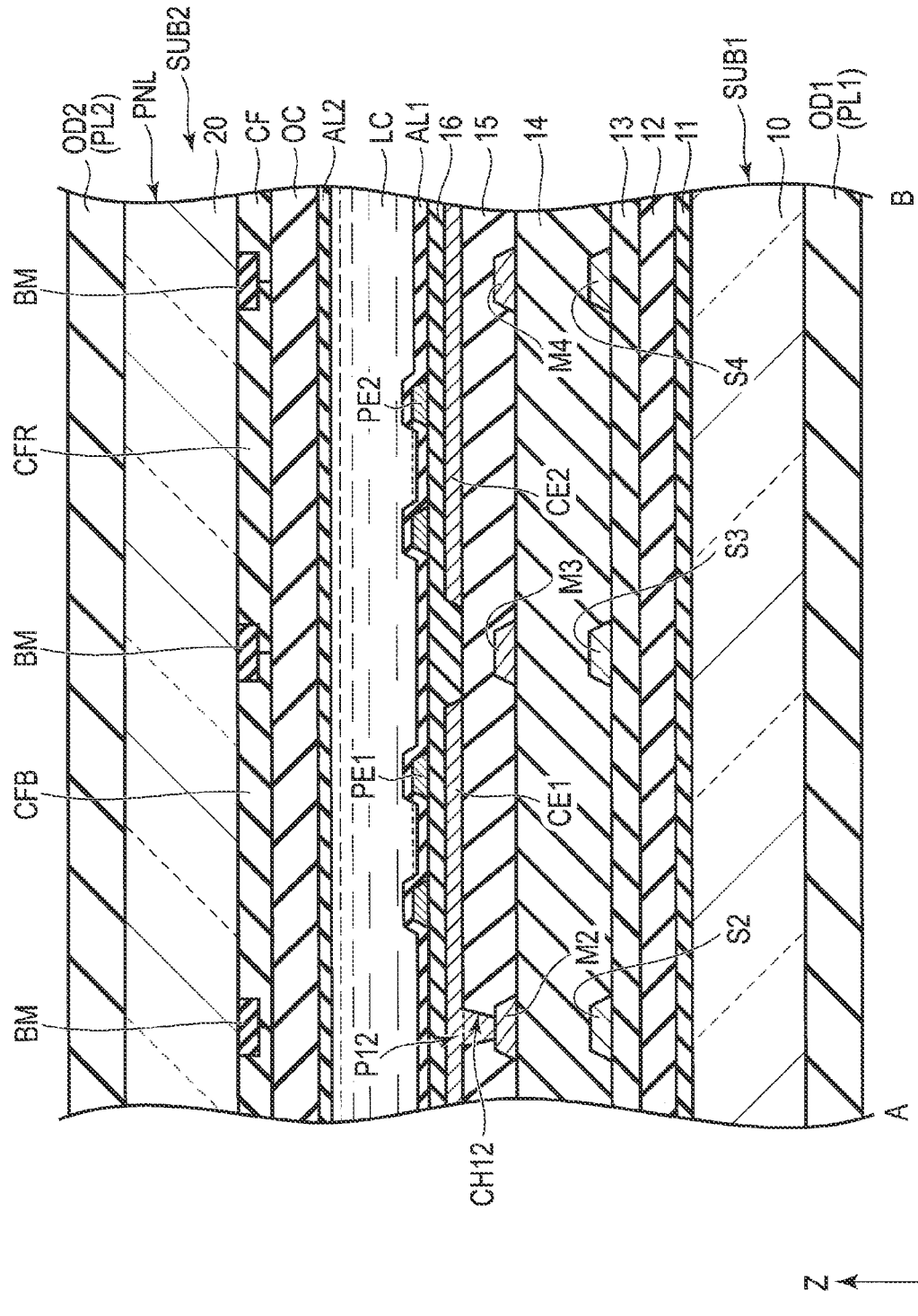
FIG. 5 is a cross-sectional view of a display panel PNL taken along line A-B shown in FIG. 4.

FIG. 5 is a cross-sectional view of the display panel PNL taken along line A-B shown in FIG. 4. The example illustrated corresponds to a case where a fringe field switching (FFS) mode, which is one of display modes using a lateral electric field, is applied.

The first substrate SUB1 comprises an insulating substrate 10, insulating films 11 to 16, the signal lines S2 to S4, the metal lines M2 to M4, the common electrodes CE1 and CE2, the pixel electrodes PE1 and PE2, an alignment film AL1 and the like. The insulating substrate 10 is a light transmissive substrate such as a glass substrate or a flexible resin substrate. The insulating films 11 to 13 are disposed in the third direction Z in this order on the insulating substrate 10. Although not illustrated in the drawing, a semiconductor layer in the switching element SW is located between the insulating films 11 and 12 and the scanning line G is located between the insulating films 12 and 13.

The signal lines S2 to S4 are located between the insulating films 13 and 14. Note that the signal lines S2 to S4 are located in the same layer as the other signal lines such as the signal line S1 which are not illustrated in the drawing. Each of the signal lines S2 to S4 is formed of layers of titanium (Ti), aluminum (Al) and titanium (Ti) which are disposed in this order in one example but may be formed of other metal materials.

The metal lines M2 to M4 are located between the insulating films 14 and 15. The metal lines M2 to M4 are located directly above the signal lines S2 to S4, respectively. The metal lines M2 to M4 are located in the same layer as the other metal lines such as the metal line M1 which are not shown in the drawing. Each of the metal lines M2 to M4 is formed of layers of titanium (Ti), aluminum (Al) and titanium (Ti) which are disposed in this order or layers of molybdenum (Mo), aluminum (Al) and molybdenum (Mo) which are disposed in this order in one example but may be formed of other metal materials.

The common electrodes CE1 and CE2 are located between the insulating films 15 and 16. The common electrodes CE1 and CE2 are transparent electrodes formed of a transparent conductive material such as indium tin oxide (ITO) or indium zinc oxide (IZO). The insulating film 15 has a through hole CH12 corresponding to the connection portion P12. The common electrode CE1 is connected to the metal line M2 via the through hole CH12.

The pixel electrodes PE1 and PE2 are located on the insulating film 16 and are covered with the alignment film AL1. The pixel electrode PE1 is located directly above the common electrode CE1, and the pixel electrode PE2 is located directly above the common electrode CE2. The pixel electrodes PE1 and PE2 are transparent electrodes formed of a transparent conductive material such as ITO or IZO.

The insulating films 11 to 13 and the insulating film 16 are inorganic insulating films such as silicon oxide, silicon nitride or silicon oxynitride and may have a single layer structure or a multilayer structure. The insulating films 14 and 15 are, for example, organic insulating films such as acrylic resin. Note that the insulating film 15 may be an inorganic insulating film.

The second substrate SUB2 comprises an insulating substrate 20, a light-shielding layer BM, a color filter layer CF, an overcoat layer OC, an alignment film AL2 and the like. The insulating substrate 20 is a light transmissive substrate such as a glass substrate or a resin substrate as is the case with the insulating substrate 10. The light-shielding layer BM and the color filter layer CF are located on a side of the insulating substrate 20 which is opposed to the first substrate SUB1. The color filter layer CF includes red, green and blue color filters. In the example illustrated, a blue color filter CFB is located directly above the pixel electrode PE1 and a red color filter CFR is located directly above the pixel electrode PE2. The overcoat layer OC covers the color filter layer CF. The alignment film AL2 covers the overcoat layer OC. The alignment films AL1 and AL2 are formed of, for example, a material exhibiting horizontal alignment properties.

A liquid crystal layer LC is located between the first substrate SUB1 and the second substrate SUB2 and is held between the alignment film AL1 and the alignment film AL2.

An optical element OD1 including a polarizer PL1 is bonded to the insulating substrate 10. An optical element OD2 including a polarizer PL2 is bonded to the insulating substrate 20.

Figure 6:
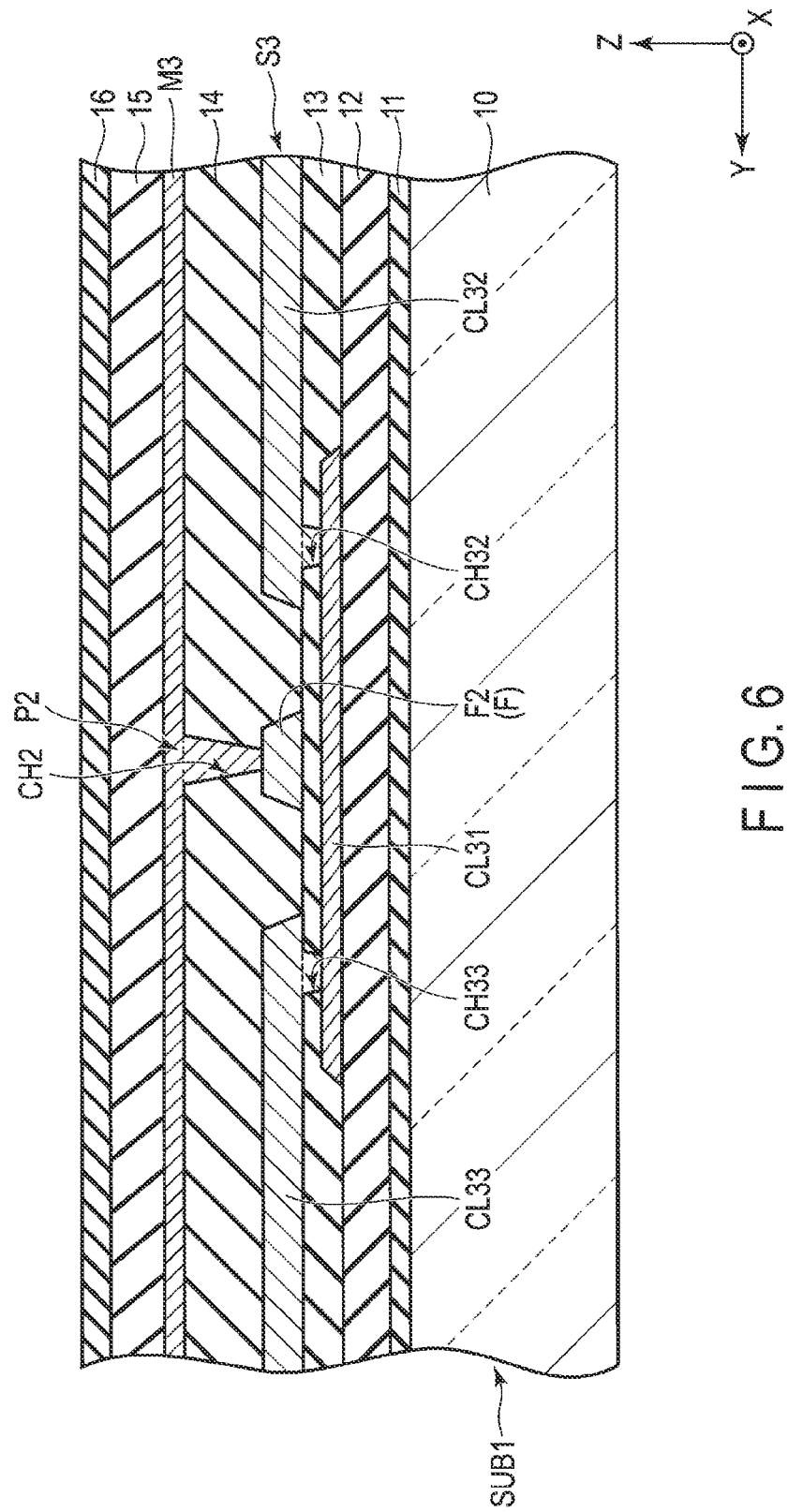
FIG. 6 is a cross-sectional view of a first substrate SUB1 taken along a signal line S3 and a metal line M3 including a connection portion P2 shown in FIG. 4.

FIG. 6 is a cross-sectional view of the first substrate SUB1 taken along the signal line S3 and the metal line M3 including the connection portion P2 shown in FIG. 4. In an area including the connection portion P2, the signal line S3 comprises a conductive layer CL31 located between the insulating films 12 and 13 and conductive layers CL32 and CL33 located between the insulating films 13 and 14. The conductive layer CL31 is located in the same layer as the scanning line G and is formed of the same material as the scanning line G. The conductive layer CL32 is formed of the same material as the conductive layer CL33. The conductive layer CL32 is connected to the conductive layer CL31 via a through hole CH32 penetrating the insulating film 13. The conductive layer CL33 is connected to the conductive layer CL31 via a through hole CH33 penetrating the insulating film 13. The conductive layer CL32 extends in the display portion DA and constitutes the main part of the signal line S3 connected to the switching elements SW.

The feed line F is located between the insulating films 13 and 14. The feed portion F2 is located directly above the conductive layer CL31 and is separated from the conductive layers CL32 and CL33. The conductive layer CL32, the feed portion F2 and the conductive layer CL33 are arranged in the second direction Y in this order on the insulating film 13. The feed line F is formed of the same material as the conductive layer CL32, etc.

The metal line M3 is located between the insulating films 14 and 15. The insulating film 14 has a through hole CH2 corresponding to the connection portion P2. The metal line M3 is connected to the feed portion F2 via the through hole CH2.

In the configuration example shown in FIG. 6, the insulating film 12 corresponds to the first insulating film, the insulating film 13 corresponds to the second insulating film, the insulating film 14 corresponds to the third insulating film, the insulating film 15 corresponds to the fourth insulating film, the conductive layer CL31 corresponds to the first conductive layer, and the conductive layers CL32 and CL33 correspond to the second conductive layer.

According to such a configuration example, the feed line F is formed of the same material as the main part (conductive layer CL32) of the signal line S3, and the step for forming the feed line F is not required separately. In addition, the signal line S3 is connected to the conductive layer (CL31) other than the feed line F at a position crossing the feed line F, and a short circuit between the feed line F and the signal line S3 is suppressed.

Figure 7:
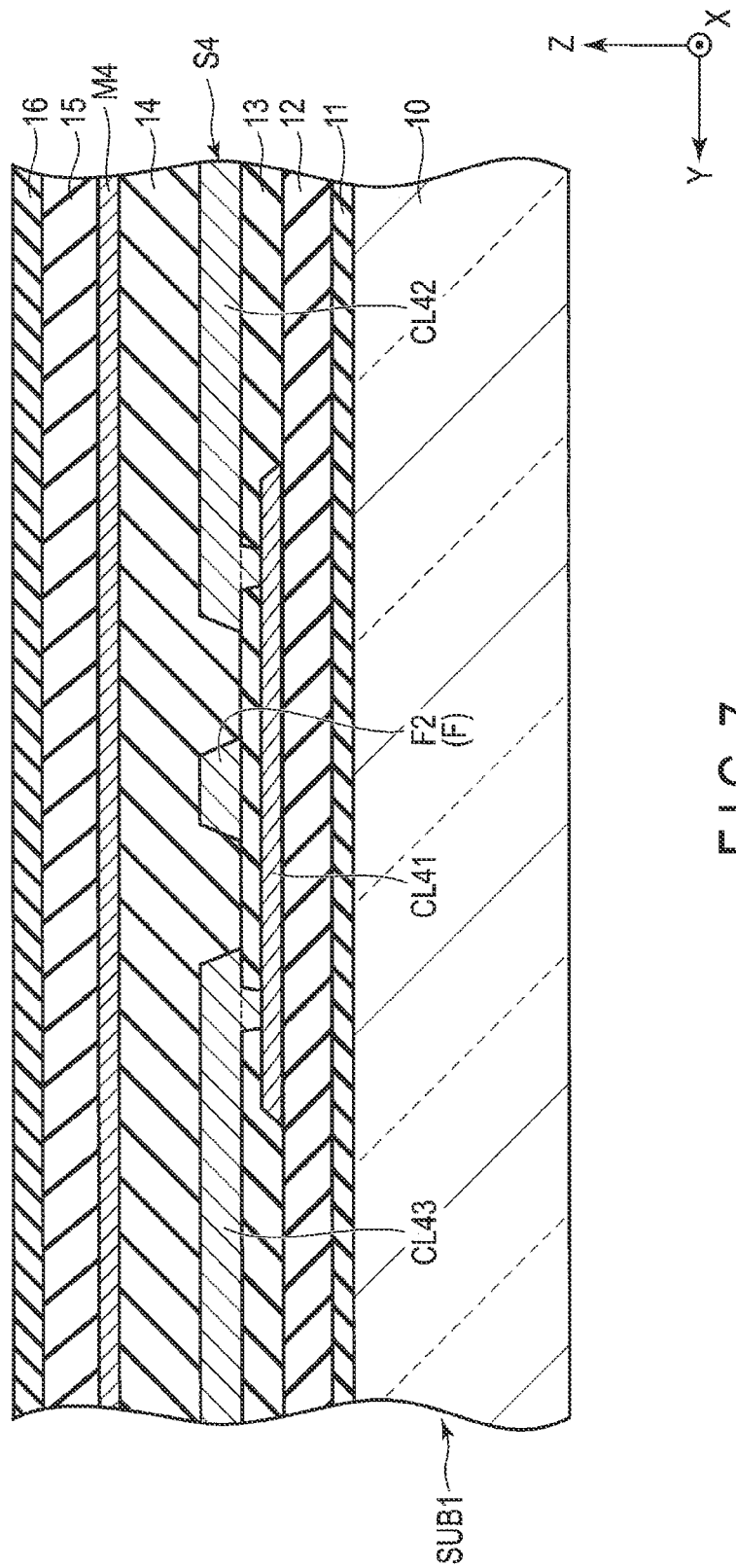
FIG. 7 is a cross-sectional view of the first substrate SUB1 taken along a signal line S4 and a metal line M4 shown in FIG. 4.

FIG. 7 is a cross-sectional view of the first substrate SUB1 taken along the signal line S4 and the metal line M4 shown in FIG. 4. The signal line S4 comprises a conductive layer CL41 located between the insulating films 12 and 13 and conductive layers CL42 and CL43 located between the insulating films 13 and 14, and the conductive layers CL41 to CL43 are connected to each other. The metal line M4 is located directly above the conductive layers CL42 and CL43 and the feed portion F2 and is not connected to the feed portion F2. Therefore, the feed line F crosses both the metal line M4 and the signal line S4 without causing a short circuit.

Figure 8:
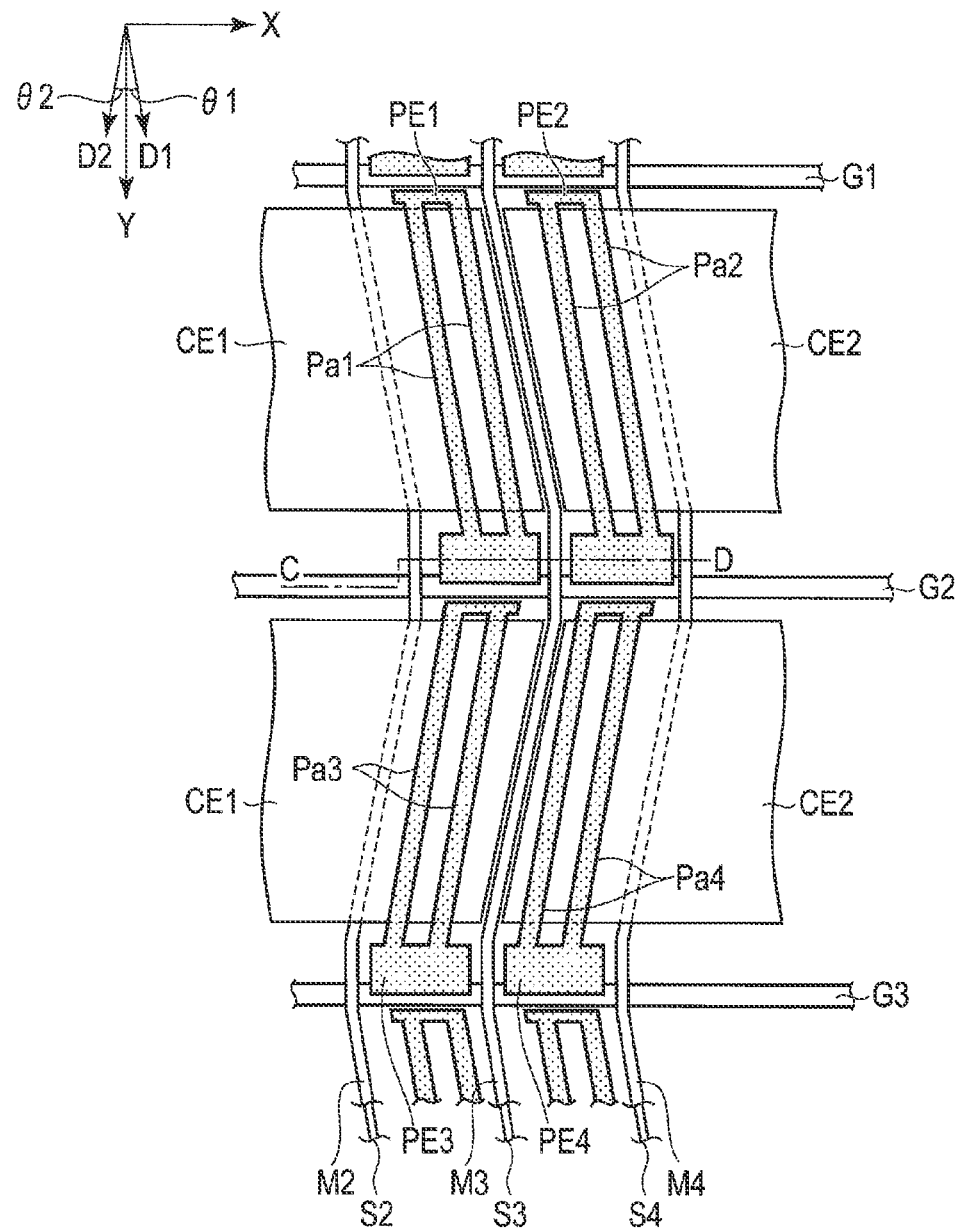
FIG. 8 is a plan view showing an example of a pixel layout.

FIG. 8 is a plan view showing an example of a pixel layout. The figure shows an enlarged view of the pixel layout in an area spreading across the pixel electrodes PE1 and PE2 shown in FIG. 4. In FIG. 8, a direction crossing the second direction Y at a counterclockwise acute angle is defined as a direction D1 and a direction crossing the second direction Y at a clockwise acute angle is defined as a direction D2. Note that an angle θ1 formed between the second direction Y and the direction D1 is substantially the same as an angle θ2 formed between the second direction Y and the direction D2.

The pixel electrodes PE1 and PE2 are disposed between the scanning lines G1 and G2. The pixel electrodes PE3 and PE4 are disposed between the scanning lines G2 and G3. The pixel electrodes PE1 and PE3 are disposed between the signal lines S2 and S3, and the pixel electrodes PE2 and PE4 are disposed between the signal lines S3 and S4. The pixel electrodes PE1 and PE2 comprise strip electrodes Pa1 and Pa2 which extend in the direction D1, respectively. The pixel electrodes PE3 and PE4 comprise strip electrodes Pa3 and Pa4 which extend in the direction D2, respectively. The number of strips of each of the strip electrodes Pa1 to Pa4 is two in the example illustrated but may be one or three or more. The pixel electrodes PE1 and PE2 overlap the common electrode CE1. The pixel electrodes PE3 and PE4 overlap the common electrode CE2. The common electrode CE2 is separated from the common electrode CE1, and they are electrically insulated from each other.

Figure 9:
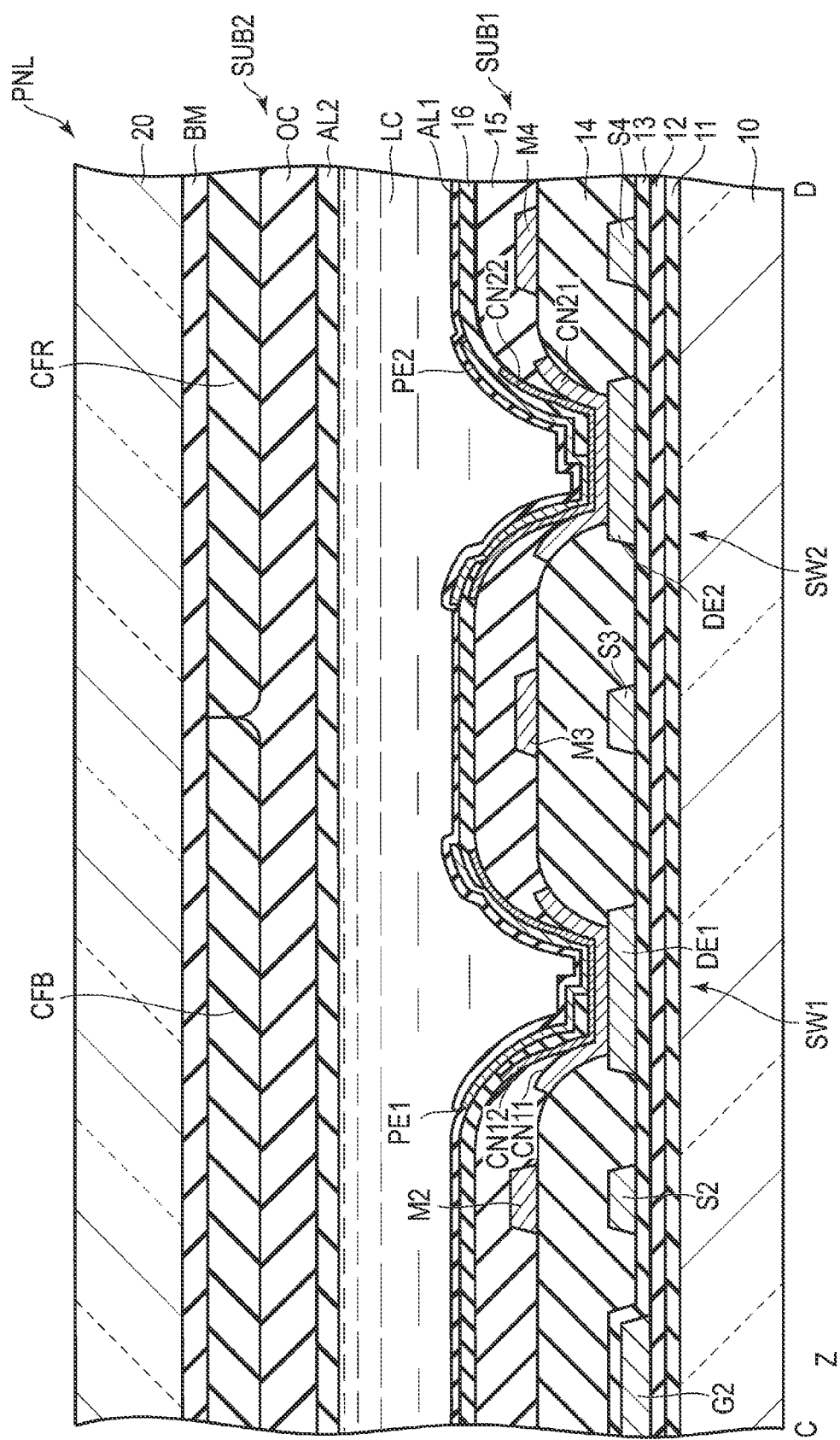
FIG. 9 is a cross-sectional view of the display panel PNL taken along line C-D shown in FIG. 8.

FIG. 9 is a cross-sectional view of the display panel PNL taken along line C-D shown in FIG. 8. Note that the semiconductor layer located between the insulating film 11 and the insulating film 12 is not illustrated in the drawing.

The scanning line G2 is located between the insulating films 12 and 13.

A drain electrode DE1 of the switching element SW1 and a drain electrode DE2 of the switching element SW2 are located between the insulating film 13 and the insulating film 14. The drain electrodes DE1 and DE2 and the signal lines S2 to S4 are formed in the same step and are formed of the same material.

A connection electrode CN11 is in contact with the drain electrode DE1, and a connection electrode CN21 is in contact with the drain electrode DE2. The connection electrodes CN11 and CN21 and the metal lines M2 to M4 are formed in the same step and are formed of the same material.

A connection electrode CN12 is in contact with the connection electrode CN11, and a connection electrode CN22 is in contact with the connection electrode CN21. The connection electrodes CN12 and CN22 and the common electrodes CE1 and CE2 shown in FIG. 8 are formed in the same step and are formed of the same material.

The pixel electrode PE1 is in contact with the connection electrode CN12, and the pixel electrode PE2 is in contact with the connection electrode CN22. Note that the pixel electrode PE1 only needs to be electrically connected to the drain electrode DE1 and one or both of the connection electrodes CN11 and CN12 may be omitted. Regarding the structure of the connection between the pixel electrode PE2 and the drain electrode DE2 also, one or both of the connection electrodes CN21 and CN22 may be omitted.

Next, another configuration example will be described.

FIG. 10 is a plan view showing another configuration example. The configuration example shown in FIG. 10 differs from the configuration example shown in FIG. 1 in that the feed line is omitted and the metal line functioning as the shield wiring line is divided into line portions in accordance with the common electrodes (or sensor electrodes) arranged in the second direction Y and the line portions are electrically connected to the common electrodes which are adjacent to them, respectively.

Common electrodes CE1 and CE2 are arranged in the first direction X and separated from each other. Common electrodes CE1 and CE3 are arranged in the second direction Y and separated from each other. The common electrode CE3 corresponds to the sensor electrode Rx2 shown in FIG. 1. The common electrodes CE2 and CE4 are arranged in the second direction Y and separated from each other.

The metal line M3 comprises a line portion M31 located between the common electrodes CE1 and CE2 and a line portion M32 located between the common electrodes CE3 and CE4. The line portions M31 and M32 are arranged in the second direction Y and separated from each other. In addition, the line portions M31 and M32 overlap the signal line S3. The line portion M31 is electrically connected to the common electrode CE1, and the line portion M32 is electrically connected to the common electrode CE3. In the example illustrated, the line portions M31 and M32 are electrically connected to the line portions of the metal line which are adjacent to them, respectively. The lengths in the second direction Y of the line portions M31 and M32 are less than the length of the metal line M4.

That is, the metal line M2 comprises line portions M21 and M22 which are arranged in the second direction Y and separated from each other. The line portions M21 and M22 overlap the signal line S2. The common electrode CE1 overlaps the line portion M21 and is electrically connected to the line portion M21. The line portions M21 and M31 are arranged in the first direction X while being separated from each other and are electrically connected to each other. A connection line MC1 for connecting the line portions M21 and M31 extends in the first direction X. Note that the line portion M31 may be directly connected to the common electrode CE1 or may be connected to another metal line (line portion) connected to the common electrode CE1. In addition, the connection line MC1 is not limited to a single line and may be a plurality of lines.

The same applies to the structure of the connection between the line portion M32 and the common electrode CE3. The common electrode CE3 overlaps the line portion M22 and is electrically connected to the line portion M22. The line portions M22 and M32 are electrically connected to each other via a connection line MC2. Note that the line portion M32 may be directly connected to the common electrode CE3 or may be connected to another metal line (line portion) connected to the common electrode CE3.

In the configuration example shown in FIG. 10, for example, the common electrode CE1 corresponds to the first common electrode, the common electrode CE2 corresponds to the second common electrode, the common electrode CE3 corresponds to the third common electrode, the metal line M3 corresponds to the first metal line, the line portion M31 corresponds to the first line portion, the line portion M32 corresponds to the second line portion, the metal line M2 corresponds to the second metal line, the line portion M21 corresponds to the third line portion, and the line portion M22 corresponds to the fourth line portion, and the metal line M4 corresponds to the third metal line.

Figure 11:
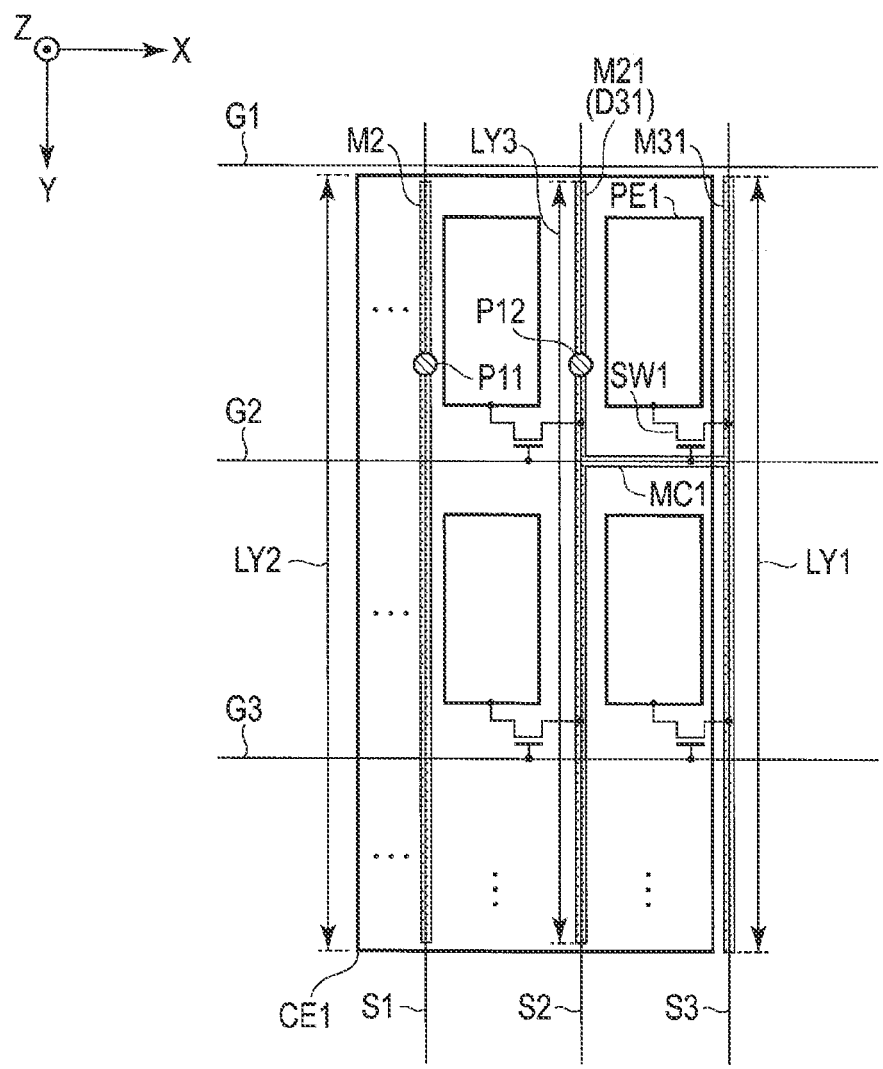
FIG. 11 is an enlarged plan view showing an area including a connection line MC1 shown in FIG. 10.

FIG. 11 is an enlarged plan view showing an area including the connection line MC1 shown in FIG. 10. The connection line MC1 overlaps the scanning line G2 between the signal lines S2 and S3 and connects the line portions M21 and M31. The connection line MC1 is integrally formed with the line portions M21 and M31 and is formed of the same material as the line portion M21, etc. The line portion M21 corresponds to the dummy wiring line D31 and is electrically connected to the common electrode CE1 in the connection portion P12. As the line portions M21 and M31 are electrically connected to each other via the connection line MC1, the line portion M31 and the common electrode CE1 become electrically connected to each other.

Regarding a length in the second direction Y, the line portion M31 has a length LY1, the common electrode CE1 has a length LY2, and the length LY1 and the length LY2 are substantially the same as each other. In addition, a length LY3 of the line portion M21 may be substantially the same as the length LY1 of the line portion M31 or may be greater than the length LY2 of the common electrode CE1.

According to such a configuration example, it is possible to obtain substantially the same effects as the above-described configuration example. Furthermore, the feed line can be omitted and the connection terminal for connecting the feed line and the signal source can be omitted.

Figure 12:
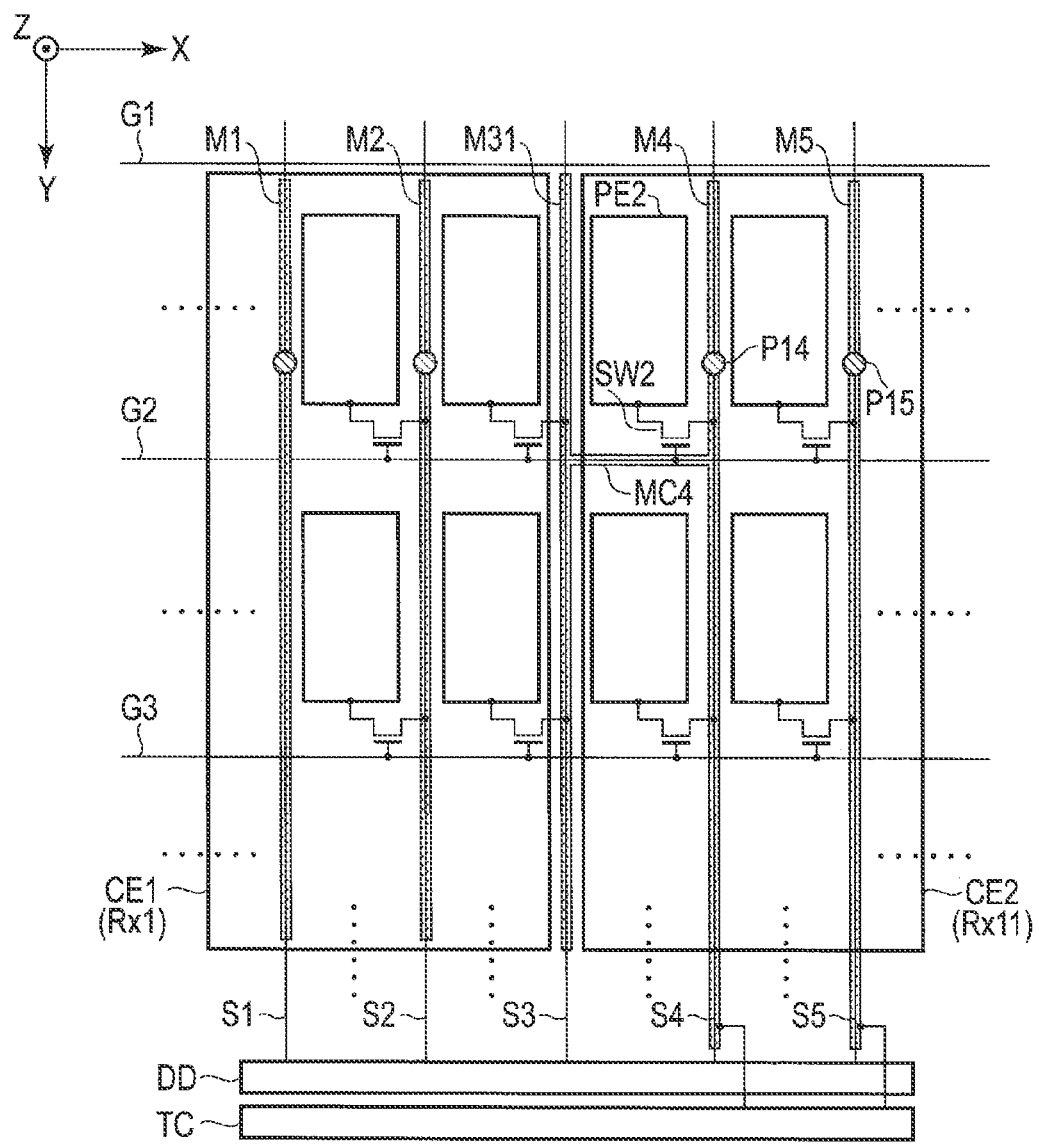
FIG. 12 is a plan view showing another configuration example.

FIG. 12 is a plan view showing another configuration example. The configuration example shown in FIG. 12 differs from the configuration examples shown in FIGS. 10 and 11 in that the metal line M4 corresponds to the sensor wiring line which electrically connects the sensor electrode Rx11 and the touch controller TC and the line portion M31 is electrically connected to the metal line M4. A connection line MC4 overlaps the scanning line G2 between the signal lines S3 and S4 and connects the line portion M31 and the metal line M4. The connection line MC4 is integrally formed with the line portion M31 and the metal line M4.

In such a configuration example also, it is possible to obtain substantially the same effects as the above-described configuration example.

As described above, the present embodiment can provide a display device which suppresses display quality degradation.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The display panel PNL of the present embodiment is not limited to a transmissive display panel having a transmissive display function of displaying an image by selectively transmitting light from a rear surface side of the first substrate SUB1 and may be a reflective display panel having a reflective display function of displaying an image by selectively reflecting light from a front surface side of the second substrate SUB2 or a transflective display panel having the transmissive display function and the reflective display function.

In addition, although the display panel PNL corresponding to a display mode using a lateral electric field along a surface of a substrate has been described in the present embodiment, the display panel PNL is not limited to this and may be a display panel of any one of a display mode using a longitudinal electric field along a normal to a surface of a substrate, a display mode using an oblique electric field which is inclined in an oblique direction with respect to a surface of a substrate, and a display mode using an appropriate combination of the above-described lateral electric field, longitudinal electric field and oblique electric field. The surface of the substrate here is a surface parallel to the X-Y plane.

What is claimed is:

1. A display device comprising:
a first common electrode and a second common electrode arranged in a first direction and separated from each other;
a first metal line located between the first common electrode and the second common electrode and extending in a second direction crossing the first direction; and
a third common electrode arranged in the second direction and separated from the first common electrode, wherein
the first metal line comprises a first line portion adjacent to the first common electrode and electrically connected to the first common electrode and a second line portion adjacent to the third common electrode and electrically connected to the third common electrode, and
the first line portion and the second line portion are arranged in the second direction and separated from each other.

2. The display device of claim 1, further comprising a second metal line, wherein
the second metal line comprises a third line portion overlapping the first common electrode and electrically connected to the first common electrode and a fourth line portion overlapping the third common electrode and electrically connected to the third common electrode,
the third line portion and the fourth line portion are arranged in the second direction and separated from each other,
the first line portion and the third line portion are arranged in the first direction and are electrically connected to each other, and
the second line portion and the fourth line portion are arranged in the first direction and are electrically connected to each other.

3. The display device of claim 2, further comprising:
a first signal line overlapping the first line portion and the second line portion; and
a second signal line overlapping the third line portion and the fourth line portion.

4. The display device of claim 3, further comprising:
a third metal line overlapping the second common electrode and extending in the second direction; and
the first line portion and the second line portion are shorter than the third metal line.

5. The display device of claim 2, further comprising:
a connection line; and
a scanning line, wherein the connection line overlaps the scanning line and electrically connects the first line portion and the third line portion.

\* \* \* \* \*